US012781332B2

(12) United States Patent
Shiojiri et al.

(10) Patent No.: US 12,781,332 B2
(45) Date of Patent: Nov. 3, 2026

(54) THERMAL SPRAY MATERIAL, THERMAL SPRAY COATING, METHOD FOR FORMING THERMAL SPRAY COATING, AND COMPONENT FOR PLASMA ETCHING DEVICE

(71) Applicants: TOCALO Co., Ltd., Kobe (JP); FUJIMI INCORPORATED, Kiyosu (JP)

(72) Inventors: Yasuhiro Shiojiri, Akashi (JP); Tatsuo Suidzu, Akashi (JP); Kensuke Taguchi, Akashi (JP); Hiroaki Mizuno, Kiyosu (JP); Takaya Masuda, Kiyosu (JP)

(73) Assignees: TOCALO CO., LTD., Kobe (JP); FUJIMI INCORPORATED, Kiyosu (JP)

( * ) Notice: Subject to any disclaimer, the term of this patent is extended or adjusted under 35 U.S.C. 154(b) by 637 days.

(21) Appl. No.: 18/266,481

(22) PCT Filed: Nov. 18, 2021

(86) PCT No.: PCT/JP2021/042483
§ 371 (c)(1),
(2) Date: Jun. 9, 2023

(87) PCT Pub. No.: WO2022/124044
PCT Pub. Date: Jun. 16, 2022

(65) Prior Publication Data

US 2024/0043982 A1 Feb. 8, 2024

(30) Foreign Application Priority Data

Dec. 10, 2020 (JP) ................................ 2020-205254

(51) Int. Cl.
*C23C 4/04* (2006.01)
*H01J 37/32* (2006.01)
*C23C 4/134* (2016.01)

(52) U.S. Cl.
CPC .......... *C23C 4/04* (2013.01); *H01J 37/32477* (2013.01); *C23C 4/134* (2016.01); *H01J 2237/334* (2013.01)

(58) Field of Classification Search
None
See application file for complete search history.

(56) References Cited

U.S. PATENT DOCUMENTS

| | | | |
|---|---|---|---|
| 4,867,639 A | 9/1989 | Strangman | |
| 2014/0234653 A1 | 8/2014 | Mizuno et al. | |
| 2015/0017463 A1 | 1/2015 | Harada et al. | |
| 2015/0064406 A1* | 3/2015 | Harada | C23C 4/10 427/419.7 |
| 2015/0096462 A1* | 4/2015 | Fukagawa | C04B 35/62655 106/14.05 |
| 2017/0283312 A1 | 10/2017 | Lee et al. | |
| 2017/0283313 A1 | 10/2017 | Lee et al. | |
| 2018/0142338 A1* | 5/2018 | Yokota | C23C 4/134 |
| 2019/0203329 A1 | 7/2019 | Ibe | |
| 2021/0130243 A1* | 5/2021 | Wilson | C04B 38/067 |

FOREIGN PATENT DOCUMENTS

| | | |
|---|---|---|
| JP | 2000-219574 A | 8/2000 |
| JP | 2002-037683 A | 2/2002 |
| JP | 2008-222532 A | 9/2008 |
| JP | 2013-177670 A | 9/2013 |
| JP | 2017-172021 A | 9/2017 |
| JP | 6261980 B2 | 1/2018 |
| JP | 2020-092151 A | 6/2020 |
| WO | WO-2018/052129 A1 | 3/2018 |

OTHER PUBLICATIONS

International Preliminary Report on Patentability and Written Opinion issued in PCT Application No. PCT/JP2021/042483 dated Jun. 22, 2023 (5 pages).

International Search Report and Written Opinion from PCT Appl. Ser. No. PCT/JP2021/042483 mailed Dec. 14, 2021, with partial English translation (8 pages).

* cited by examiner

*Primary Examiner* — Stefanie J Cohen
(74) *Attorney, Agent, or Firm* — Foley & Lardner LLP

(57) ABSTRACT

There is provided a thermal spray coating which has excellent plasma erosion resistance, which protects members of a plasma etching device from plasma erosion over a long period of term, and which can contribute to the stable production of devices and a longer life of members. The thermal spray material which is one aspect of this invention contains a composite compound containing a rare earth fluoride in the proportion of 40 mol % or more and 80 mol % or less, a magnesium fluoride in the proportion of 10 mol % or more and 40 mol % or less, and a calcium fluoride in the proportion of 0 mol % or more and 40 mol % or less.

20 Claims, No Drawings

THERMAL SPRAY MATERIAL, THERMAL SPRAY COATING, METHOD FOR FORMING THERMAL SPRAY COATING, AND COMPONENT FOR PLASMA ETCHING DEVICE

CROSS-REFERENCE TO RELATED APPLICATIONS

This application is a U.S. National Stage Application of PCT International Application No. PCT/JP2021/042483, filed Nov. 18, 2021, which claims priority to Japanese Patent Application No. 2020-205254, filed Dec. 10, 2020, the disclosures of which are incorporated by reference herein in their entireties.

TECHNICAL FIELD

The present invention relates to a thermal spray material, a thermal spray coating, a method for forming a thermal spray coating, and a component for plasma etching device.

BACKGROUND ART

In the semiconductor device manufacturing field, the surface of a semiconductor substrate is generally microfabricated by dry etching using plasma of a halogen-based gas, such as fluorine, chlorine, or bromine, inside a vacuum chamber. After the dry etching, the inside of the chamber after the semiconductor substrate is taken out is cleaned using oxygen gas plasma. This poses a risk that corrosion thinning (erosion) occurs in a member exposed to reactive plasma in the chamber, and a corroded part drops off in the form of particles to be particles. The adhesion of the particles to the semiconductor substrate has a possibility of causing defects in a circuit.

Thus, to reduce the generation of the particles, the member exposed to the reactive plasma in the chamber has been protected from plasma erosion by providing the member with a thermal spray coating having high plasma erosion resistance.

For example, PTL 1 describes the provision of a layer containing dense fluoride ceramics mainly containing at least one selected from $CaF_2$, $MgF_2$, $YF_3$, $AlF_3$, and $CeF_3$ and having a porosity of 2% or less as the thermal spray coating having high plasma erosion resistance.

PTL 2 describes the formation of an oxide film by spraying a thermal spray powder containing rare earth elements and Group II elements of the periodic table to the member exposed to the reactive plasma to form a film which is less likely to generate particles having a large size when subjected to the plasma erosion.

PTL 3 describes a thermal spray material containing composite particles containing a plurality of yttrium fluoride fine particles integrated together and having a lightness L in Lab color space of 91 or less as a thermal spray material capable of forming a thermal spray coating having improved plasma erosion resistance.

PTL 4 describes one satisfying the following configurations (1) to (4) as a base material with film having a thermal spray coating which has high plasma resistance, is difficult to peel off, has excellent acid resistance, and has a high surface resistance value on the surface of the base material. (1) The film thickness is 10 to 1000 μm. (2) The film contains a fluoride and an oxide of a rare earth element (Ln) as the main component. (3) In the surface of the film, a particulate part [α1] containing the oxide of the rare earth element (Ln) as the main component, having a monoclinic structure, and having a diameter of 10 nm to 1 μm and a particulate part [β1] containing the fluoride of the rare earth element (Ln) as the main component, having an orthorhombic structure, and having a diameter of 10 nm to 1 μm are dispersed and present in an amorphous matrix containing the fluoride of the rare earth element (Ln) as the main component. (4) When the surface of the film is observed using an optical microscope at 200×, a white stain-like part having a maximum diameter of 50 to 1000 μm is observed, and the ratio of the area of this stain-like part occupied in the field of view is 0.01 to 2%.

CITATION LIST

Patent Literatures

PTL 1: JP 2000-219574 A
PTL 2: JP 6261980 B2
PTL 3: WO 2018/052129
PTL 4: JP 2017-172021 A

SUMMARY OF INVENTION

Technical Problem

However, the thermal spray coatings described in PTL 1 to 4 have room for improvement in having excellent plasma erosion resistance and protecting members of the plasma etching device from the plasma erosion over a long period of term.

It is an object of the present invention to provide a thermal spray coating which has excellent plasma erosion resistance, which protects members of the plasma etching device from the plasma erosion over a long period of term, and which can contribute to stable production of devices and a longer life of the members.

Solution to Problem

To solve the above-described problem, a first aspect of the present invention provides a thermal spray material containing a composite compound containing a rare earth fluoride in the proportion of 40 mol % or more and 80 mol % or less, a magnesium fluoride in the proportion of 10 mol % or more and 40 mol % or less, and a calcium fluoride in the proportion of 0 mol % or more and 40 mol % or less.

A second aspect of the present invention provides a thermal spray coating containing a rare earth fluoride in the proportion of 40 mol % or more and 80 mol % or less, a magnesium fluoride in the proportion of 10 mol % or more and 40 mol % or less, and a calcium fluoride in the proportion of 0 mol % or more and 40 mol % or less, containing a crystalline phase and an amorphous phase, and having a crystallinity of 1% or more and 75% or less.

Advantageous Effects of Invention

The thermal spray material of the first aspect of the present invention enables the formation of a thermal spray coating which has excellent plasma erosion resistance, which protects members of the plasma etching device from the plasma erosion over a long period of term, and which can contribute to the stable production of devices and a longer life of members.

The thermal spray coating of the second aspect of the present invention can be expected to a thermal spray coating which has excellent plasma erosion resistance, which protects members of the plasma etching device from the plasma erosion over a long period of term, and which can contribute to the stable production of devices and a longer life of members.

A method for forming a thermal spray coating using the thermal spray material of the first aspect of the present invention enables the formation of a thermal spray coating which has excellent plasma erosion resistance, which protects members of the plasma etching device from the plasma erosion over a long period of term, and which can contribute to the stable production of devices and a longer life of members.

DESCRIPTION OF EMBODIMENTS

Hereinafter, an embodiment of the present invention is described, but the present invention is not limited to the embodiment described below. The embodiment described below contains technically preferable limitations for implementing the present invention, but the limitations are not essential to the present invention.

A thermal spray material of this embodiment contains a composite compound containing a fluoride of a rare earth element in the proportion of 40 mol % or more and 80 mol % or less, a magnesium fluoride in the proportion of mol % or more and 40 mol % or less, and a calcium fluoride in the proportion of 0 mol % or more and 40 mol % or less. The proportion of the magnesium fluoride is preferably 20 mol % or more and 40 mol % or less.

The fluoride of the rare earth element is preferably an yttrium fluoride.

The composite compound is a granulated powder of yttrium fluoride primary particles, magnesium fluoride primary particles, and calcium fluoride primary particles having an average particle size of 10 μm or less, and the average particle size of the granulated powder is preferably 5 μm or more and 40 μm or less.

The composite compound is preferably a granulated sintered powder obtained by sintering the granulated powder.

The thermal spray coating formed by thermally spraying the thermal spray material of this embodiment under general conditions contains the fluoride of the rare earth element in the proportion of 40 mol % or more and 80 mol % or less, the magnesium fluoride in the proportion of 10 mol % or more and 40 mol % or less, and the calcium fluoride in the proportion of 0 mol % or more and 40 mol % or less, contains a crystalline phase and an amorphous phase, and has a crystallinity of 1% or more and 75% or less. The crystallinity of the thermal spray coating can be calculated based on a diffraction pattern obtained by X-ray diffraction.

The fluoride of the rare earth element is preferably an yttrium fluoride.

The porosity of the thermal spray coating is preferably 2.0 area % or less.

A method for forming a thermal spray coating of this embodiment is a method for forming the thermal spray coating containing the fluoride of the rare earth element in the proportion of 40 mol % or more and 80 mol % or less, the magnesium fluoride in the proportion of 10 mol % or more and 40 mol % or less, and the calcium fluoride in the proportion of 0 mol % or more and 40 mol % or less and containing a crystalline phase and an amorphous phase using the composite compound containing the fluoride of the rare earth element in the proportion of 40 mol % or more and 80 mol % or less, the magnesium fluoride in the proportion of 10 mol % or more and 40 mol % or less, and the calcium fluoride in the proportion of 0 mol % or more and 40 mol % or less.

The composite compound used in this method preferably contains the fluoride of the rare earth element in the proportion of 40 mol % or more and 80 mol % or less, the magnesium fluoride in the proportion of 20 mol % or more and 40 mol % or less, and the calcium fluoride in the proportion of 0 mol % or more and 40 mol % or less.

The fluoride of the rare earth element constituting the composite compound used in this method is preferably an yttrium fluoride.

The method for forming a thermal spray coating of this embodiment enables the formation of the thermal spray coating having a porosity of 2.0 area % or less.

The method for forming a thermal spray coating of this embodiment enables the formation of the thermal spray coating having a crystallinity of 1% or more and 75% or less.

A component for plasma etching device of this embodiment is a component for plasma etching device having a surface coated with the thermal spray coating described above.

The thermal spray material of this embodiment enables the formation of the thermal spray coating which has excellent plasma erosion resistance, which protects members of the plasma etching device from plasma erosion over a long period of term, and which can contribute to the stable production of devices and a longer life of members.

The thermal spray coating of this embodiment can be expected to the thermal spray coating which has excellent plasma erosion resistance, which protects members of the plasma etching device from plasma erosion over a long period of term, and which can contribute to the stable production of devices and a longer life of members.

The method for forming a thermal spray material of this embodiment enables the formation of the thermal spray coating which has excellent plasma erosion resistance, which protects members of the plasma etching device from plasma erosion over a long period of term, and which can contribute to the stable production of devices and a longer life of members.

[Method for Manufacturing Thermal Spray Material]

The composite compound constituting the thermal spray material of the first aspect of the present invention is formed of a material containing at least the fluoride of the rare earth element and fluorides of Group II elements. The composite compound can be manufactured by granulating primary particles containing the fluoride of the rare earth element and primary particles containing the fluorides of Group II elements into a spherical shape, for example. The composite compound can also be manufactured by further sintering the granulated powder while maintaining the composition of the primary particles.

A granulation technique is not particularly limited, and various known granulation methods can be employed. For example, specifically, one or more methods, such as a tumbling granulation method, a fluidized bed granulation method, a stirring granulation method, a compression granulation method, an extrusion granulation method, a crushing granulation method, a spray drying method, and the like can be employed. The spray drying method is preferable. For sintering the granulated powder, general batch sintering furnace, continuous sintering furnace, and the like are usable without particular limitation.

In a general granulated powder, fine particles, which are primary particles, are in a state of being simply integrally aggregated through a binder (bonded by a binder), for example. Between the fine particles in such a granulated powder, relatively large pores are present. Thus, in the general granulated powder, the presence of the relatively large pores between the fine particles has significance of "granulation".

In contrast, when the granulated powder is sintered, the binder disappears and the fine particles are directly bonded to reduce surface energy. This realizes the integrally bonded composite particles as described above. As the sintering proceeds, the area of the bonded part (interface) gradually increases, so that the bonding strength is further enhanced. The mass transfer in the sintered particles causes the fine particles to round into more stable spheres. At the same time, pores present inside the granulated powder are expelled and densification occurs.

Sintering conditions for the sintering are not particularly limited insofar as the composition of the primary particles does not change in a state where the sintering has sufficiently proceeded. As for the sintering conditions, for example, heating at 600° C. or more and less than the melting point (for example, less than 1200° C.) in a non-oxidizing atmosphere can be used as a rough guideline.

The sintering atmosphere can be set to an inert atmosphere or a vacuum atmosphere, for example, such that the composition is not altered. The inert atmosphere in this case means an oxygen-free atmosphere, and can be set to an oxygen-free atmosphere, such as a rare gas atmosphere, such as argon (Ar), neon (Ne), and helium (He), a non-oxidizing atmosphere, such as nitrogen ($N_2$), or the like. When the batch sintering furnace is used, the atmosphere in the furnace may be set to the non-oxidizing atmosphere, for example. When the continuous sintering furnace is used, the sintering may be carried out by introducing a non-oxidizing airflow into a region where heating is performed (a region where sintering proceeds) in the sintering furnace, for example.

[Base Material]

In the component for plasma etching device having a surface coated with a thermal spray coating of a second aspect of the present invention (base material with film having the film on its surface), a base material on which the thermal spray coating is formed is not particularly limited. For example, the materials, shapes, and the like of the base material are not particularly limited insofar as the base material contains materials which can have desired resistance when subjected to the thermal spraying of the thermal spray material. The materials constituting the base material include, for example, metal materials including various metals, semimetals, and alloys thereof, and various inorganic materials.

Specifically, the metal materials include: metal materials, such as aluminum, aluminum alloys, iron, steel, copper, copper alloys, nickel, nickel alloys, gold, silver, bismuth, manganese, zinc, and zinc alloys; semimetal materials, such as Group IV semiconductors, such as silicon (Si) and germanium (Ge), Group II-VI compound semiconductors, such as zinc selenide (ZnSe), cadmium sulfide (CdS), and zinc oxide (ZnO), Group III-V compound semiconductors, such as gallium arsenide (GaAs), indium phosphide (InP), and gallium nitride (GaN), Group IV compound semiconductors, such as silicon carbide (SiC) and silicon germanium (SiGe), and chalcopyrite semiconductors, such as copper indium selenium ($CuInSe_2$); and the like. The inorganic materials include: substrate materials, such as calcium fluoride ($CaF_2$) and quartz ($SiO_2$); oxide ceramics, such as alumina ($Al_2O_3$) and zirconia ($ZrO_2$); nitride ceramics, such as silicon nitride ($Si_3N_4$), boron nitride (BN), and titanium nitride (TiN); carbide ceramics, such as silicon carbide (SiC) and tungsten carbide (WC); and the like.

Any one of these materials may constitute the base material, or two or more of these materials may be combined to constitute the base material. In particular, suitable examples include base materials containing metal materials having a relatively large thermal expansion coefficient among generally used metal materials, such as steel typified by various SUS materials (which can be so-called stainless steel), heat-resistant alloys typified by Inconel and the like, low-expansion alloys, such as Invar and Kovar, corrosion-resistant alloys, such as Hastelloy, and aluminum alloys typified by 1000 series to 7000 series aluminum alloys useful as lightweight structural materials and the like.

Such base materials may be, for example, members constituting a semiconductor device manufacturing apparatus and exposed to highly reactive oxygen gas plasma or halogen gas plasma. For example, silicon carbide (SiC) and the like described above can be classified into different categories as the compound semiconductors, the inorganic materials, and the like for convenience of use or the lie, but can be the same material.

[Method for Forming Thermal Spray Coating]

The thermal spray coating of the second aspect can be formed by subjecting the thermal spray material of the first aspect to a thermal spraying device based on a known thermal spraying method. More specifically, a powdery thermal spray material is sprayed in a state of being softened or melted by a heat source, such as combustion or electrical energy, so that a thermal spray coating containing such a material is formed. The thermal spraying method for thermally spraying the thermal spray material is not particularly limited. For example, it is suitable to employ thermal spraying methods, such as a plasma spraying method, a high-speed flame spraying method, a flame spraying method, and a detonation spraying method.

The properties of the thermal spray coating can depend on the thermal spraying method and the spraying conditions to some extent. However, no matter which thermal spraying methods and thermal spraying conditions are employed, the use of the thermal spray material disclosed herein enables the formation of a thermal spray coating having improved plasma erosion resistance as compared with a case of using other thermal spray materials.

The plasma spraying method is a thermal spraying method utilizing a plasma flame as the thermal spray heat source for softening or melting the thermal spray material. When an arc is generated between electrodes and a working gas is converted into plasma by the arc, the plasma flow is ejected in the form of a high-temperature and high-speed plasma jet from a nozzle. The plasma spraying method includes general coating techniques in which the thermal spray material is charged into the plasma jet, heated, accelerated and deposited on the base material to obtain a thermal spray coating.

The plasma spraying method can be an aspect of atmospheric plasma spraying (APS) in which the plasma spraying is performed in the atmosphere, low pressure plasma spraying (LPS) in which the plasma spraying is performed in a pressure lower than the atmospheric pressure, high pressure plasma spraying in which the plasma spraying is performed in a pressurized container higher than the atmospheric pressure, or the like. According to such plasma spraying, for example, the thermal spray material is melted and accelerated by the plasma jet of about 5000° C. to 10000° C., so that the thermal spray material can be made to collide with the base material at a speed of about 300 m/s to 600 m/s and deposited thereon as an example.

EXAMPLES

Hereinafter, Examples of the present invention are described.

[Preparation of Thermal Spray Material]

<No. 1>

First, an yttrium fluoride ($YF_3$) powder having an average primary particle size of 3.0 μm, a calcium fluoride ($CaF_2$) powder having an average primary particle size of 1.0 μm, and a magnesium fluoride ($MgF_2$) powder having an average primary particle size of 4.0 μm were dispersed in a dispersion medium with a resin binder in the proportion of 50 mol % $YF_3$, 20 mol % $CaF_2$, and 30 mol % $MgF_2$ to obtain a raw material dispersion liquid. The ratio of the resin binder was set to 1.0 mass part based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 120 minutes under conditions of an Ar atmosphere and 800° C. to obtain a granulated sintered powder. The composition of the obtained granulated sintered powder did not change and remained at 50 mol % $YF_3$, 20 mol % $CaF_2$, and 30 mol % $MgF_2$, and the average particle size of the particles classified by sieving and the airflow was 30 μm. The granulated sintered powder thus obtained was designated as No. 1 thermal spray material.

<No. 2>

First, an yttrium fluoride ($YF_3$) powder having an average primary particle size of 1.0 μm and a magnesium fluoride ($MgF_2$) powder having an average primary particle size of 4.0 μm were dispersed in a dispersion medium with a resin binder in the proportion of 64 mol % $YF_3$ and 36 mol % $MgF_2$ to obtain a raw material dispersion liquid. The ratio of the resin binder was set to 1.0 mass part based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 180 minutes under conditions of a vacuum atmosphere and 780° C. to obtain a granulated sintered powder. The composition of the obtained granulated sintered powder did not change and remained at 64 mol % $YF_3$ and 36 mol % $MgF_2$, and the average particle size of the particles classified by sieving and the airflow was μm. The granulated sintered powder thus obtained was designated as No. 2 thermal spray material.

<No. 3>

First, an yttrium fluoride ($YF_3$) powder having an average primary particle size of 0.5 μm, a calcium fluoride ($CaF_2$) powder having an average primary particle size of 1.0 μm, and a magnesium fluoride ($MgF_2$) powder having an average primary particle size of 5.0 μm were dispersed in a dispersion medium with a resin binder in the proportion of 50 mol % $YF_3$, 25 mol % $CaF_2$, and 25 mol % $MgF_2$ to obtain a raw material dispersion liquid. The ratio of the resin binder was set to 1.5 mass parts based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 120 minutes under conditions of a $N_2$ atmosphere and 850° C. to obtain a granulated sintered powder. The composition of the obtained granulated sintered powder did not change and remained at 50 mol % $YF_3$, 25 mol % $CaF_2$, and 25 mol % $MgF_2$, and the average particle size of the particles classified by sieving and the airflow was 30 μm. The granulated sintered powder thus obtained was designated as No. 3 thermal spray material.

<No. 4>

First, an yttrium fluoride ($YF_3$) powder having an average primary particle size of 2.0 μm, a calcium fluoride ($CaF_2$) powder having an average primary particle size of 4.0 μm, and a magnesium fluoride ($MgF_2$) powder having an average primary particle size of 3.0 μm were dispersed in a dispersion medium with a resin binder in the proportion of 64 mol % $YF_3$, 12 mol % $CaF_2$, and 24 mol % $MgF_2$ to obtain a raw material dispersion liquid. The ratio of the resin binder was set to 1.0 mass part based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 150 minutes under conditions of an Ar atmosphere and 860° C. to obtain a granulated sintered powder. The composition of the obtained granulated sintered powder did not change and remained at 64 mol % $YF_3$, 12 mol % $CaF_2$, and 24 mol % $MgF_2$, and the average particle size of the particles classified by sieving and the airflow was 34 μm. The granulated sintered powder thus obtained was designated as No. 4 thermal spray material.

<No. 5>

First, an yttrium fluoride ($YF_3$) powder having an average primary particle size of 3.0 μm, a calcium fluoride ($CaF_2$) powder having an average primary particle size of 1.0 μm, and a magnesium fluoride ($MgF_2$) powder having an average primary particle size of 8.0 μm were dispersed in a dispersion medium with a resin binder in the proportion of 50 mol % $YF_3$, 20 mol % $CaF_2$, and 30 mol % $MgF_2$ to obtain a raw material dispersion liquid. The ratio of the resin binder was set to 1.5 mass parts based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 180 minutes under conditions of a vacuum atmosphere and 830° C. to obtain a granulated sintered powder. The composition of the obtained granulated sintered powder did not change and remained at 50 mol % $YF_3$, 20 mol % $CaF_2$, and 30 mol % $MgF_2$, and the average particle size of the particles classified by sieving and the airflow was 22 μm. The granulated sintered powder thus obtained was designated as No. 5 thermal spray material.

<No. 6>

The granulated powder obtained by performing granulation by the spray drying method in No. 1 was not sintered, and designated as a thermal spray material No. 6 as it was. The average particle size of the particles classified by sieving and the airflow was 32 μm.

<No. 7>

The granulated powder obtained by performing granulation by the spray drying method in No. 2 was introduced into a multi-atmosphere furnace and sintered for about 120 minutes under conditions of an Ar atmosphere and 850° C. to obtain a granulated sintered powder. The composition of the obtained granulated sintered powder did not change and remained at 64 mol % $YF_3$ and 36 mol % $MgF_2$, and the average particle size of the particles classified by sieving and the airflow was 46 μm. The granulated sintered powder thus obtained was designated as No. 7 thermal spray material.

<No. 8>

The granulated powder obtained by performing granulation by the spray drying method in No. 2 was introduced into a multi-atmosphere furnace and sintered for about 120 minutes under conditions of an Ar atmosphere and 870° C. to obtain a granulated sintered powder. The composition of the obtained granulated sintered powder did not change and remained at 64 mol % $YF_3$ and 36 mol % $MgF_2$, and the average particle size of the particles classified by sieving and the airflow was 52 μm. The granulated sintered powder thus obtained was designated as No. 8 thermal spray material.

<No. 9>

The granulated powder obtained by performing granulation by the spray drying method in No. 2 was introduced into a multi-atmosphere furnace and sintered for about 120 minutes under conditions of a vacuum atmosphere and 850° C. to obtain a granulated sintered powder. The composition of the obtained granulated sintered powder did not change and remained at 64 mol % $YF_3$ and 36 mol % $MgF_2$, and the average particle size of the particles classified by sieving and the airflow was 10 μm. The granulated sintered powder thus obtained was designated as No. 9 thermal spray material.

<No. 10>

The granulated powder obtained by performing granulation by the spray drying method in No. 2 was introduced into a multi-atmosphere furnace and sintered for about 120 minutes under conditions of a vacuum atmosphere and 860° C. to obtain a granulated sintered powder. The composition of the obtained granulated sintered powder did not change and remained at 64 mol % $YF_3$ and 36 mol % $MgF_2$, and the average particle size of the particles classified by sieving and the airflow was 8 μm. The granulated sintered powder thus obtained was designated as No. 10 thermal spray material.

<No. 11>

First, an yttrium fluoride ($YF_3$) powder having an average primary particle size of 3.0 μm, a calcium fluoride ($CaF_2$) powder having an average primary particle size of 0.8 μm, and a magnesium fluoride ($MgF_2$) powder having an average primary particle size of 4.0 μm were dispersed in a dispersion medium with a resin binder in the proportion of 30 mol % $YF_3$, 20 mol % $CaF_2$, and 50 mol % $MgF_2$ to obtain a raw material dispersion liquid. The ratio of the resin binder was set to 2.0 mass parts based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 120 minutes under conditions of a $N_2$ atmosphere and 800° C. to obtain a granulated sintered powder. The composition of the obtained granulated sintered powder did not change and remained at 30 mol % $YF_3$, 20 mol % $CaF_2$, and 50 mol % $MgF_2$, and the average particle size of the particles classified by sieving and the airflow was 25 μm. The granulated sintered powder thus obtained was designated as No. 11 thermal spray material.

<No. 12>

First, an yttrium fluoride ($YF_3$) powder having an average primary particle size of 3.0 μm and a calcium fluoride ($CaF_2$) powder having an average primary particle size of 2.0 μm were dispersed in a dispersion medium with a resin binder in the proportion of 30 mol % $YF_3$ and 70 mol % $CaF_2$ to obtain a raw material dispersion liquid. The ratio of the resin binder was set to 1.0 mass part based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 180 minutes under conditions of an Ar atmosphere and 750° C. to obtain a granulated sintered powder. The composition of the obtained granulated sintered powder did not change and remained at 30 mol % $YF_3$ and 70 mol % $CaF_2$, and the average particle size of the particles classified by sieving and the airflow was 48 μm. The granulated sintered powder thus obtained was designated as No. 12 thermal spray material.

<No. 13>

First, an yttrium fluoride ($YF_3$) powder having an average primary particle size of 1.0 μm and a calcium fluoride ($CaF_2$) powder having an average primary particle size of 1.0 μm were dispersed in a dispersion medium with a resin binder in the proportion of 71 mol % $YF_3$ and 29 mol % $CaF_2$ to obtain a raw material dispersion liquid. The ratio of the resin binder was set to 2.5 mass parts based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 30 minutes under conditions of a vacuum atmosphere and 900° C. to obtain a granulated sintered powder. The composition of the obtained granulated sintered powder did not change and remained at 71 mol % $YF_3$ and 29 mol % $CaF_2$, and the average particle size of the particles classified by sieving and the airflow was 26 μm. The granulated sintered powder thus obtained was designated as No. 13 thermal spray material.

<No. 14>

First, an yttrium fluoride ($YF_3$) powder having an average primary particle size of 2.0 μm and a calcium fluoride ($CaF_2$) powder having an average primary particle size of 2.0 μm were dispersed in a dispersion medium with a resin binder in the proportion of 80 mol % $YF_3$ and 20 mol % $CaF_2$ to obtain a raw material dispersion liquid. The ratio of the resin binder was set to 1.5 mass parts based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 60 minutes under conditions of an Ar atmosphere and 800° C. to obtain a granulated sintered powder. The composition of the obtained granulated sintered powder did not change and remained at 80 mol % $YF_3$ and 20 mol % $CaF_2$, and the average particle size of the particles classified by sieving and the airflow was 49 μm. The granulated sintered powder thus obtained was designated as No. 14 thermal spray material.

<No. 15>

First, an yttrium fluoride ($YF_3$) powder having an average primary particle size of 5.0 μm and a calcium fluoride ($CaF_2$) powder having an average primary particle size of 1.0 μm were dispersed in a dispersion medium with a resin binder in the proportion of 91 mol % $YF_3$ and 9 mol % $CaF_2$ to obtain a raw material dispersion liquid. The ratio of the resin binder was set to 1.0 mass part based on 100 mass parts of the entire powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 240 minutes under conditions of a $N_2$ atmosphere and 700° C. to obtain a granulated sintered powder. The composition of the obtained granulated sintered powder did not change and remained at 91 mol % $YF_3$ and 9 mol % $CaF_2$, and the average particle size of the particles classified by sieving and the airflow was 25 μm. The granulated sintered powder thus obtained was designated as No. 15 thermal spray material.

<No. 16>

First, an yttrium fluoride ($YF_3$) powder having an average primary particle size of 5.0 μm was dispersed in a dispersion medium with a resin binder to obtain a raw material dispersion liquid. The ratio of the resin binder was set to 1.0 mass part based on 100 mass parts of the powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 120 minutes under conditions of a vacuum atmosphere and 1050° C. to obtain a granulated sintered powder. The composition of the obtained granulated sintered powder was 100 mol % $YF_3$, and the average particle size of the particles classified by sieving and the airflow was 25 μm. The granulated sintered powder thus obtained was designated as No. 16 thermal spray material.

<No. 17>

First, a calcium fluoride ($CaF_2$) powder having an average primary particle size of 1.0 μm was dispersed in a dispersion medium with a resin binder to obtain a raw material dispersion liquid. The ratio of the resin binder was set to 1.5 mass parts based on 100 mass parts of the powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 120 minutes under conditions of a vacuum atmosphere and 1200° C. to obtain a granulated sintered powder. The composition of the obtained granulated sintered powder was 100 mol % $CaF_2$, and the average particle size of the particles classified by sieving and the airflow was 25 μm. The granulated sintered powder thus obtained was designated as No. 17 thermal spray material.

<No. 18>

First, a magnesium fluoride ($MgF_2$) powder having an average primary particle size of 4.0 μm was dispersed in a dispersion medium with a resin binder to obtain a raw material dispersion liquid. The ratio of the resin binder was set to 2.0 mass parts based on 100 mass parts of the powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into a multi-atmosphere furnace and sintered for about 60 minutes under conditions of an Ar atmosphere and 1050° C. to obtain a granulated sintered powder. The composition of the obtained granulated sintered powder was 100 mol % $MgF_2$, and the average particle size of the particles classified by sieving and the airflow was 25 μm. The granulated sintered powder thus obtained was designated as No. 18 thermal spray material.

<No. 19>

First, an yttrium fluoride ($YF_3$) powder having an average primary particle size of 0.5 μm, a calcium fluoride ($CaF_2$) powder having an average primary particle size of 1.0 μm, and a magnesium fluoride ($MgF_2$) powder having an average primary particle size of 5.0 μm were mixed in the proportion of 50 mol % $YF_3$, 25 mol % $CaF_2$, and 25 mol % $MgF_2$ to obtain a mixture.

Next, the obtained mixture was introduced into a multi-atmosphere furnace, melted by sintering for about 120 minutes under conditions of an Ar atmosphere and 1150° C., and then the melted mass was crushed with a roll jaw crusher or a grinder, thereby obtaining a powder having an average particle size of the particles classified by sieving and the airflow of 30 μm. The composition of the obtained powder did not change and remained at 50 mol % $YF_3$, 25 mol % $CaF_2$, and 25 mol % $MgF_2$. The powder thus obtained was designated as No. 19 thermal spray material.

<No. 20>

First, an yttrium fluoride ($YF_3$) powder having an average particle size of 30.0 μm, a calcium fluoride ($CaF_2$) powder having an average particle size of 30.0 μm, and a magnesium fluoride ($MgF_2$) powder having an average particle size of 30.0 μm were mixed in the proportion of mol % $YF_3$, 25 mol % $CaF_2$, and 25 mol % $MgF_2$ to obtain a mixed powder having an average particle size of 30.0 μm. The mixed powder thus obtained was designated as No. 20 thermal spray material.

<No. 21>

First, an yttrium oxide ($Y_2O_3$) powder having an average primary particle size of 3.0 μm was dispersed in a dispersion medium with a resin binder to obtain a raw material dispersion liquid. The ratio of the resin binder was set to 1.0 mass part based on 100 mass parts of the powder.

Next, the raw material dispersion liquid was sprayed into the airflow using a spray dryer, and then the dispersion medium was evaporated from spray droplets, thereby preparing a granulated powder. More specifically, the granulation was performed by the spray drying method. Next, the obtained granulated powder was introduced into an atmosphere sintering furnace and sintered for about 300 minutes under conditions of an air atmosphere and 1600° C. to obtain a granulated sintered powder. The composition of the obtained granulated sintered powder was 100 mol % $Y_2O_3$, and the average particle size of the particles classified by sieving and the airflow was 25 μm. The granulated sintered powder thus obtained was designated as No. 21 thermal spray material.

[Formation of Thermal Spray Coating]

The thermal spray materials No. 1 to No. 21 were sprayed to the base material to form thermal spray coatings.

Thermal spraying conditions were as follows.

First, a plate material (20 mm×20 mm×2 mm) formed of an aluminum alloy (A6061) was prepared as the base material which is the thermal spray material. A thermal spraying surface of the base material was blasted with an alumina abrasive.

The thermal spraying was performed by an atmospheric pressure plasma spraying method using a commercially available plasma spraying device (Metco (trademark) F4 Series manufactured by Oerlikon Metco). As thermal spraying conditions, plasma was generated using an argon gas and a hydrogen gas as plasma working gases, and a thermal spray coating having a thickness of 200 μm was formed.

The thermal spray coatings No. 1 to No. 21 thus obtained were investigated for the porosity, crystallinity, and erosion rate by the following methods. The results are shown in Table 1 together with the configuration of each of the thermal spray materials.

(Porosity)

The porosity was calculated by the following method.

First, the base material on which each of the thermal spray coatings No. 1 to No. 21 was formed was cut perpendicularly to the surface on which the thermal spray coating was formed, the cut material was embedded in resin, the cross section generated by the cutting was polished, and then an image of the cross section of the film was taken using a scanning electron microscope (JSM-IT300LA manufactured by JEOL Ltd.). Next, by analyzing the image of the cross-section of the film using image analysis software (WinROOF2018 manufactured by MITANI CORPORATION), the area of pore parts in the image of the cross-section of the film was identified, and the ratio (area %) of the area of the pore parts occupied in the entire cross section was calculated. This calculated value was set as the porosity. The results are shown in column of "Porosity" of "Thermal spray coating" in Table 1.

(Crystallinity)

Each of the thermal spray coatings No. 1 to No. 21 was placed on a sample holder of an X-ray diffractometer (SmartLab manufactured by Rigaku Corporation) to obtain a diffraction pattern. Thereafter, the integrated scattering intensity of the amorphous phase and the integrated scattering intensity of the crystalline phase based on the obtained diffraction pattern were defined, and the crystallinity was calculated from the following equation. The integrated scattering intensity corresponds to the area of the diffraction peak.

"crystallinity=Integrated scattering intensity of crystalline phase/(Integrated scattering intensity of crystalline phase+Integrated scattering intensity of amorphous phase)"

The results are shown in the column of "Crystallinity" of "Thermal spray coating" in Table 1.

(Erosion Rate)

Each of the thermal spray coatings No. 1 to No. 21 was mirror-polished, and then placed on a silicon wafer set on a stage in a chamber of an inductively coupled (ICP) plasma etching device (RIE-101iPH manufactured by Samco Inc.).

Subsequently, plasma was generated using a mixed gas of a fluorine type ($CF_4$), oxygen, and Ar (flow ratio 7:1:9) and the silicon wafer and the thermal spray coating were etched. The exposure time with each plasma was set to 45 minutes.

A plasma exposure test was performed as described above, and then the thickness reduction amount of the silicon wafer and the thermal spray coating due to the plasma was measured as an etching amount (erosion amount). The plasma erosion rate of each of the thermal spray coatings was converted to a value when the erosion rate of the silicon wafer was set to 100. The thickness reduction amount of the silicon wafer and the thermal spray coating was determined by measuring the level difference between a masked sample center part and a plasma exposed surface using a laser microscope (VK-X250/X260 manufactured by Keyence Corporation).

TABLE 1

| | Configuration of thermal spray material | | | | | | | | | | | | | | |
|---|---|---|---|---|---|---|---|---|---|---|---|---|---|---|---|
| | Ratio of primary particles (mol %) | | | Average primary particle size (μm) | | | Manufacturing method | Average particle size | Configuration of thermal spray coating | | | | | | |
| | | | | | | | | | Ratio of fluoride (mol %) | | | Porosity | Crystallinity | Erosion | |
| No. | $YF_3$ | $CaF_2$ | $MgF_2$ | $YF_3$ | $CaF_2$ | $MgF_2$ | | | $YF_3$ | $CaF_2$ | $MgF_2$ | (area %) | (%) | rate | |
| 1 | 50 | 20 | 30 | 3.0 | 1.0 | 4.0 | Granulation-Sintering | 30 μm | 56 | 20 | 24 | 0.9 | 61.4 | 12.0 | |
| 2 | 64 | 0 | 36 | 1.0 | — | 4.0 | Granulation-Sintering | 25 μm | 70 | 0 | 30 | 1.5 | 32.7 | 13.0 | |
| 3 | 50 | 25 | 25 | 0.5 | 1.0 | 5.0 | Granulation-Sintering | 30 μm | 54 | 24 | 22 | 0.9 | 71.5 | 13.0 | |
| 4 | 64 | 12 | 24 | 2.0 | 4.0 | 3.0 | Granulation-Sintering | 34 μm | 73 | 13 | 14 | 0.9 | 39.3 | 14.3 | |
| 5 | 50 | 20 | 30 | 3.0 | 1.0 | 8.0 | Granulation-Sintering | 22 μm | 54 | 20 | 26 | 1.0 | 71.0 | 12.5 | |
| 6 | 50 | 20 | 30 | 3.0 | 1.0 | 4.0 | Granulation | 32 μm | 56 | 20 | 24 | 1.2 | 69.0 | 12.0 | |
| 7 | 64 | 0 | 36 | 1.0 | — | 4.0 | Granulation-Sintering | 46 μm | 70 | 0 | 30 | 1.8 | 62.5 | 14.8 | |
| 8 | 64 | 0 | 36 | 1.0 | — | 4.0 | Granulation-Sintering | 52 μm | 67 | 0 | 33 | 2.1 | 65.0 | 15.0 | |
| 9 | 64 | 0 | 36 | 1.0 | — | 4.0 | Granulation-Sintering | 10 μm | 71 | 0 | 29 | 0.7 | 64.0 | 12.8 | |
| 10 | 64 | 0 | 36 | 1.0 | — | 1.0 | Granulation-Sintering | 8 μm | 72 | 0 | 28 | 0.6 | 62.4 | 12.5 | |
| 11 | 30 | 20 | 50 | 3.0 | 0.8 | 4.0 | Granulation-Sintering | 25 μm | 38 | 22 | 39 | 1.1 | 95.9 | 14.6 | |
| 12 | 30 | 70 | 0 | 3.0 | 2.0 | — | Granulation-Sintering | 48 μm | 34 | 66 | 0 | 3.3 | 97.7 | 16.1 | |
| 13 | 71 | 29 | 0 | 1.0 | 1.0 | — | Granulation-Sintering | 26 μm | 73 | 27 | 0 | 3.0 | 92.7 | 15.2 | |
| 14 | 80 | 20 | 0 | 2.0 | 2.0 | — | Granulation-Sintering | 49 μm | 81 | 19 | 0 | 3.0 | 97.7 | 15.0 | |
| 15 | 91 | 9 | 0 | 5.0 | 1.0 | — | Granulation-Sintering | 25 μm | 91 | 9 | 0 | 2.8 | 94.6 | 14.9 | |
| 16 | 100 | 0 | 0 | 5.0 | — | — | Granulation-Sintering | 25 μm | 100 | 0 | 0 | 3.2 | 100 | 18.9 | |

TABLE 1-continued

| | Configuration of thermal spray material | | | | | | | | Configuration of thermal spray coating | | | | | | |
|---|---|---|---|---|---|---|---|---|---|---|---|---|---|---|---|
| | Ratio of primary particles (mol %) | | | Average primary particle size (μm) | | | | | Ratio of fluoride (mol %) | | | | | | |
| No. | $YF_3$ | $CaF_2$ | $MgF_2$ | $YF_3$ | $CaF_2$ | $MgF_2$ | Manufacturing method | Average particle size | $YF_3$ | $CaF_2$ | $MgF_2$ | Porosity (area %) | Crystallinity (%) | Erosion rate |
| 17 | 0 | 100 | 0 | — | 1.0 | — | Granulation-Sintering | 25 μm | 0 | 100 | 0 | 3.3 | 100 | 16.2 |
| 18 | 0 | 0 | 100 | — | — | 4.0 | Granulation-Sintering | 25 μm | 0 | 0 | 100 | 2.9 | 100 | 14.5 |
| 19 | 50 | 25 | 25 | 0.5 | 1.0 | 5.0 | Granulation-Crushing | 30 μm | 52 | 24 | 24 | 0.6 | 98.0 | 18.0 |
| 20 | 50 | 25 | 25 | 30.0 | 30.0 | 30.0 | Blend | 30 μm | 53 | 24 | 23 | 0.6 | 98.0 | 18.0 |
| 21 | $Y_2O_3$ having an average primary particle size of 3.0 μm | | | | | | Granulation-Sintering | 25 μm | | | | 2.6 | 100 | 13.6 |

The results in Table 1 reveal the following.

In examples No. 1 to No. 10, both the thermal spray material and the thermal spray coating satisfy that "The fluoride of the rare earth element is contained in the proportion of 40 mol % or more and 80 mol % or less.", "The magnesium fluoride is contained in the proportion of 10 mol % or more and 40 mol % or less.", "The calcium fluoride was contained in the proportion of 0 mol % or more and 40 mol % or less.", and "The fluoride of the rare earth element is an yttrium fluoride.".

In examples No. 1 to No. 10, the composite compound constituting the thermal spray material satisfies that "The composite compound is a granulated powder of yttrium fluoride primary particles, magnesium fluoride primary particles, and calcium fluoride primary particles having an average particle size of 10 μm or less or a granulated sintered powder obtained by sintering this granulated powder."

Therefore, the thermal spray coatings formed by thermal spraying the thermal spray materials No. 1 to No. 10 under general conditions become thermal spray coatings containing the crystalline phase and the amorphous phase, and the porosity of the thermal spray coatings was able to be set to 2.1 area % or less and the crystallinity of the thermal spray coatings was able to be set to 32.7% or more and 71.5% or less. The erosion rate of the formed thermal spray coatings was able to be set to 15.0% or less. Particularly in No. 1 to No. 3, No. 5, No. 6, No. 9, and No. 10, the erosion rate of the formed thermal spray coatings was able to be set to 13.0% or less.

Further, in the thermal spray materials No. 1 to No. 6, No. 9, and No. 10 having an average particle size of μm or less among the thermal spray materials No. 1 to No. 10, the porosity of the thermal spray coatings was able to be set to 1.5 area % or less.

In contrast thereto, the thermal spray coatings formed by thermal spraying the thermal spray materials No. 11 to No. 21 under general conditions had a crystallinity as high as 92.7% or more and an erosion rate of 14.6% or more, and particularly No. 12 to No. 18 had a high porosity value of 2.8 area % or more.

The invention claimed is:

1. A thermal spray material comprising:

a composite compound containing a rare earth fluoride in a proportion of 40 mol % or more and 80 mol % or less, a magnesium fluoride in a proportion of 10 mol % or more and 40 mol % or less, and a calcium fluoride in a proportion of more than 0 mol % and 40 mol % or less.

2. The thermal spray material according to claim 1, wherein the rare earth fluoride is an yttrium fluoride.

3. The thermal spray material according to claim 2, wherein the composite compound is a granulated powder of an yttrium fluoride, a magnesium fluoride, and a calcium fluoride having an average particle size of primary particles of 10 μm or less, and the granulated powder has an average particle size of 5 μm or more and 40 μm or less.

4. The thermal spray material according to claim 3, wherein the composite compound is a granulated sintered powder obtained by sintering the granulated powder.

5. A thermal spray coating comprising:

a rare earth fluoride in a proportion of 40 mol % or more and 80 mol % or less, a magnesium fluoride in a proportion of 10 mol % or more and 40 mol % or less, and a calcium fluoride in a proportion of more than 0 mol % and 40 mol % or less, containing a crystalline phase and an amorphous phase, and having a crystallinity of 1% or more and 75% or less.

6. The thermal spray coating according to claim 5, wherein the rare earth fluoride is an yttrium fluoride.

7. The thermal spray coating according to claim 5, wherein a porosity is 2.0 area % or less.

8. A method for forming a thermal spray coating, comprising:

forming the thermal spray coating according to claim 5 using a thermal spray material comprising a composite compound containing a rare earth fluoride in a proportion of 40 mol % or more and 80 mol % or less, a magnesium fluoride in a proportion of 10 mol % or more and 40 mol % or less, and a calcium fluoride in a proportion of more than 0 mol % and 40 mol % or less.

9. A component for plasma etching device, having a surface coated with the thermal spray coating according to claim 5.

10. The thermal spray coating according to claim 6, wherein a porosity is 2.0 area % or less.

11. The method for forming a thermal spray coating according to claim 8, wherein the rare earth fluoride is an yttrium fluoride.

12. The method for forming a thermal spray coating according to claim 11, wherein the composite compound is a granulated powder of an yttrium fluoride, a magnesium fluoride, and a calcium fluoride having an average particle size of primary particles of 10 μm or less, and the granulated powder has an average particle size of 5 μm or more and 40 μm or less.

13. The method for forming a thermal spray coating according to claim 12, wherein the composite compound is a granulated sintered powder obtained by sintering the granulated powder.

14. A method for forming a thermal spray coating, comprising:

forming the thermal spray coating according to claim 7 using a thermal spray material comprising a composite compound containing a rare earth fluoride in a proportion of 40 mol % or more and 80 mol % or less, a magnesium fluoride in a proportion of 10 mol % or more and 40 mol % or less, and a calcium fluoride in a proportion of more than 0 mol % and 40 mol % or less.

15. The method for forming a thermal spray coating according to claim 14, wherein the rare earth fluoride is an yttrium fluoride.

16. The method for forming a thermal spray coating according to claim 15, wherein the composite compound is a granulated powder of an yttrium fluoride, a magnesium fluoride, and a calcium fluoride having an average particle size of primary particles of 10 μm or less, and the granulated powder has an average particle size of 5 μm or more and 40 μm or less.

17. The method for forming a thermal spray coating according to claim 16, wherein the composite compound is a granulated sintered powder obtained by sintering the granulated powder.

18. A component for plasma etching device, having a surface coated with the thermal spray coating according to claim 6.

19. A component for plasma etching device, having a surface coated with the thermal spray coating according to claim 7.

20. The thermal spray material of claim 1, wherein the calcium fluoride is present in a proportion of 12 mol % or more and 40 mol % or less.

* * * * *